United States Patent
Ila (10) Patent No.: US 8,841,539 B2
(45) Date of Patent: Sep. 23, 2014

(54) HIGH EFFICIENCY THERMOELECTRIC DEVICE

(75) Inventor: Daryush Ila, Huntsville, AL (US)

(73) Assignee: Fayetteville State University, Fayetteville, NC (US)

( * ) Notice: Subject to any disclaimer, the term of this patent is extended or adjusted under 35 U.S.C. 154(b) by 154 days.

(21) Appl. No.: 13/429,412

(22) Filed: Mar. 25, 2012

(65) Prior Publication Data

US 2013/0247949 A1  Sep. 26, 2013

(51) Int. Cl.
*H01L 35/28* (2006.01)
*G01K 7/02* (2006.01)
*H01L 35/12* (2006.01)

(52) U.S. Cl.
CPC . *H01L 35/12* (2013.01); *G01K 7/02* (2013.01)
USPC ............................. 136/203; 136/238; 136/224

(58) Field of Classification Search
CPC ......... H01L 35/12; H01L 35/22; H01L 35/14; G01K 7/02
USPC ................................................. 136/200–240
See application file for complete search history.

(56) References Cited

U.S. PATENT DOCUMENTS

| | | | |
|---|---|---|---|
| 5,288,336 A | 2/1994 | Strachan et al. | 136/200 |
| 6,534,784 B2 | 3/2003 | Eliasson et al. | 257/25 |
| 6,605,772 B2 | 8/2003 | Harman et al. | |
| 7,179,986 B2 | 2/2007 | Harman et al. | |
| 7,687,705 B2 | 3/2010 | Ila | 136/224 |
| 2007/0235070 A1* | 10/2007 | Ila | 136/224 |

OTHER PUBLICATIONS

Dames, Chris and Chen, Gang, "1ω, 2ω, and 3ω methods for measurements of thermal properties" Review of scientific Instruments 76, (2005).
Delan, A. et al., "Thermal conductivity of ultra low-k dielectrics," Microelectronic Engineering 70 (2003) 280-284.
Song, D. W. et al., "Thermal conductivity of skutterudite thin films and superlattices" Applied Physics Letters vol. 77, No. 23, Dec. 4, 2000, pp. 3854-3856.
Kim, E. K. et al, "Thermal boundary resistance at Ge2Sb2Te5/ZnS: SiO2 interface," Applied Physics Letters vol. 76, No. 26, Jun. 26, 2000 pp. 3864-3866.
Mavrokefalos, Anastassios et al., "Four-probe measurements of the in-plane Thermoelectric properties of nanofilms," Review of Scientific Instruments 78, 034901-1-034901-6 (2007).
Alvarez-Quintana, J. et al, "Extension of the 3w method to measure the thermal conductivity of thin films without a reference sample," Sensors and Actuators 0924-4247 Jan. 2007.
Liu, J.L. et al., "Growth of Ge Quantum dot superlattices for thermoelectric applications," Journal of Crystal Growth 227-228 (2001) pp. 1111-1115.

(Continued)

*Primary Examiner* — Keith Hendricks
*Assistant Examiner* — Kourtney S Carlson
(74) *Attorney, Agent, or Firm* — James Richards (57) ABSTRACT

A thermoelectric device based on a multilayer structure having alternate layers of metal/material mixture. The alternate layers have differing metal content. The layer structure is irradiated with ionizing radiation to produce nanoclusters in the layers. The differing metal content serves to quench the nanoclusters to isolate nanoclusters along the radiation track. The result is a thermoelectric device with a high figure of merit. In one embodiment, the multilayer structure is fabricated and then irradiated with high energy radiation penetrating the entire layer structure. In another embodiment, layers are irradiated sequentially during fabrication using low energy radiation.

20 Claims, 10 Drawing Sheets

(56) References Cited

OTHER PUBLICATIONS

Cahill, David G., "Thermal conductivity measurements from 30 to 750K: the 3ω method," Review of Scientific Instrumentation, 61(2), Feb. 1990 pp. 802-808.

Nakamoto, Go et al. "Thermoelectric properties of $Zn_{13-x}Sb_{10}$ compounds at low temperatures" Journal of Alloys and Compounds, vol. 437, Issues 1-2, Sep. 25, 2006, pp. 151-156.

Ramesh Chandra Mallik, Jae-Yong Jung, V. Damodara Das, Soon-Chul Ur and Il-Ho Kim "Thermoelectric properties of $Sn_zCo_8Sb_{24}$ skutterudites" Solid State Communications, vol. 141, Issue 4, Nov. 7, 2006, pp. 233-237.

J.L. Mi, X.B. Zhao, T.J. Zhu and J. Ma "Thermoelectric properties of skutterudites $Fe_xNi_yCo_{1-x-y}Sb_3$ (x=y)" Journal of Alloys and Compounds, Dec. 4, 2006, 5 pages.

Shigeru Katsuyama, Ryosuke Matsuo and Mikio Ito "Thermoelectric properties of half-Heusler alloys $Zr_{1-x}Y_xNiSn_{1-y}Sb_y$," Journal of Alloys and Compounds, vol. 428, Issues 1-2, May 15, 2006, pp. 262-267.

H.J. Liu, Ch.M. Song, S.T. Wu and L.F. Li "Processing method dependency of thermoelectric properties of $Bi_{85}Sb_{15}$ alloys in low temperature", Cryogenics, vol. 47, Issue 1, Jan. 2007, pp. 56-60.

Taek-Soo Kim and Byong-Sun Chun "Microstructure and thermoelectric properties of n- and p-type $Bi_2Te_3$ alloys by rapid solidification processes" Journal of Alloys and Compounds, vol. 437, Issues 1-2, 28 Nov. 9, 2006, pp. 225-230.

M. Takashiri, T. Shirakawa, K. Miyazaki and H. Tsukamoto, "Fabrication and characterization of $Bi_{0.4}Te_{3.0}Sb_{1.6}$ thin films by flash evaporation method," Journal of Alloys and Compounds, vol. 441, Issues 1-2, Nov. 13, 2006, pp. 246-250.

Jiangying Peng, et al. "Effect of Fe substitution on the thermoelectric transport properties of $CoSb_3$-based Skutterudite compound," Journal of Alloys and Compounds, vol. 426, Issues 1-2, Mar. 10, 2006, pp. 7-11.

E. Alleno, D. Bérardan, C. Godart, M. Puyet, B. Lenoir, R. Lackner, E. Bauer, L. Girard and D. Ravot Double filling in skutterudites: A promising path to improved thermoelectric properties, Physica B: Condensed Matter, vol. 383, Issue 1, Aug. 15, 2006, pp. 103-106.

Wen-Lin Wang, Chi-Chao Wan and Yung-Yun Wang, "Composition-dependent characterization and optimal control of electrodeposited Bi2Te3 films for thermoelectric application", Electrochimica Acta, vol. 52, Issue 23, Jul. 10, 2007, pp. 6502-6508 Available online Apr. 24, 2007.

B. Zheng, S. Budak, R. L. Zimmerman, C. Muntele, B. Chhay and D. Ila, "Effect of Layer Thickness on Thermoelectric Properties of Multilayered Si1-xGe x/Si after Bombardment by 5MeV Si Ions", Surface and Coating Technology Available online Mar. 12, 2007.

S. Budak, C. I. Muntele, R. A. Minamisawa, B. Chhay, and D. Ila, "Effects of MeV Si ions Bombardments on Thermoelectric Properties of Sequenetially Deposited BixTe3/Sb2Te3 Nanolayers", Nuc. Instr. and Meth. B Available online Mar. 28, 2007.

S. Budak, C. Muntele, B. Zheng, D. Ila, "MeV Si ions Bombardement Effect on Thermoelectric Properties of Sequenetially Deposited SiO2/AuxSiO2(1-x) Nanolayers", Nuc. Instr. and Meth. B. Available online Mar. 28, 2007.

Ila et al., Nano-cluster engineer: A combined ion implantation/co-deposition and ionizing radiation, Nuclear Instruments and Methods in Physics Research B, 191, pp. 416-421, Feb. 8, 2002.

Xiao et al., MeV Si ion bombardments of thermoelectric BixTe3/Sb2Te3 multilayer thin films for reducing thermal conductivity, Nuclear Instruments and Methods in Physics Research B, 241, pp. 568-572, Aug. 15, 2005.

Zimmerman et al., Ion beam assisted formation of nanolayers, Nuclear Instruments and Methods in Physics Research B, 241, pp. 506-510, Nov. 4, 2005.

Budak et al., Effect of MeV Si Ion Bombardment on Thermoelectric Characteristics of Sequentially Deposited Si02/AuxSi02(1-x) Nanolayers, Materials Research Society Symposium Proceedings, 929, 0929-1104-10, Apr. 2006.

* cited by examiner

HIGH EFFICIENCY THERMOELECTRIC DEVICE

FIELD OF THE INVENTION

The present invention pertains generally to the field of Thermoelectric Devices, more particularly to the field of materials and treatments yielding improved efficiency in thermoelectric devices.

BACKGROUND OF THE INVENTION

Thermoelectric (TE) devices convert heat directly to electrical power, or conversely, create cooling directly from electrical power. The devices are entirely solid state, with no moving parts to wear out. They are very rugged and can last indefinitely. Their two main shortcomings have been A) low efficiency, and B) operation at high temperatures. The low efficiency relegates TE devices to a few applications where their simplicity and ruggedness outweighs the inefficiency, such as sensors and waste heat energy converters. More recently, advances in semiconductor TE devices have made practical small coolers and temperature controllers that can both heat or cool as needed to control a temperature. Applications range from cooling computer chips, cooling seats in cars, recharging car batteries from engine wasted heated to appliances for the home.

The potential for TE devices, however, is much greater. If the efficiency can be increased and the reduce the operational temperatures near room temperature (300K), TE devices can begin to supplant mechanical compressor refrigeration systems, gasoline generators, geothermal power production and more. TE devices could play a significant role in the energy production, home heating/cooling and general energy management of the future.

More recent advances in TE devices have shown that quantum dot and superlattice structures combined with semiconductor technology can produce even higher efficiency factors. One such example is disclosed in U.S. Pat. No. 6,605,772 filed May 24, 2001 by Harman, wherein Pb Se Te/Pb Te quantum dot superlattice structure was said to be capable of a figure of merit (ZT) of 0.9 near room temperature (300K). Another example is shown in the U.S. Pat. No. 7,687,705 titled "Efficient Thermoelectric Device," filed Apr. 9, 2007 by ILA. The above mentioned patent documents are hereby incorporated herein by reference.

Although improvements have been made, further improvement in lowering operational temperature and efficiency are needed before TE devices can compete with the energy conversion machines that presently dominate industry. To reach their full potential, these improvements will need to use techniques that can be manufactured economically and result in rugged and reliable devices.

Therefore there is a clear need for thermoelectric devices that have improved efficiency, are easy to manufacture, and are rugged and reliable devices in the field.

BRIEF DESCRIPTION OF THE INVENTION

Briefly, the present invention relates to a thermoelectric device based on a multilayer structure having alternate layers of metal/material mixture. The alternate layers have differing metal content. The layer structure is irradiated with ionizing radiation to produce nanoclusters in the layers. The differing metal content serves to quench the nanoclusters to isolate nanoclusters along the radiation track. The result is a thermoelectric device with a high figure of merit. In one embodiment, the multilayer structure is fabricated and then irradiated with high energy radiation penetrating the entire layer structure. In another embodiment, layers are irradiated sequentially during fabrication using low energy radiation.

The present invention relates to a thermoelectric device based on application of a process to fine control the phonon propagation in the device via reflection and absorption phonon blocking, taking advantage of a combined deposited nanolayered composite structure and the electronics energy deposited by incident ions, in order to process low operational temperature efficient TE device comprising a multilayer composite structure of alternating insulator/metal materials. The device may be fabricated either by bombarding during the deposition process (Ion Beam Assisted Deposition, MAD), after each layer is deposited, or bombarded by MeV ions after deposition of a stack of nanolayers. The ionizing radiation produces nanoclusters/nanocrystals of the metal material in the layered structure that increase the electrical conductivity and decrease the thermal conductivity thereby increasing the thermoelectric figure of merit. In referring to the invention, the terms "nanocluster," "nanocrystal," and "quantum dot" are used in this disclosure interchangeably to refer to the atomic structures of metal material produced by the ionizing radiation. The size of the nanoclusters depends on the energy deposited, and depends on the concentration of metal species in each layer, that is, the lower the deposited energy the smaller the size of the nanocrystals. Similarly, the lower the concentration of deposited metal, the smaller the size of nanocrystals and the lower the volume fraction of nanocrystals. This is true for ion bombardment by low energy ions during the deposition (IBAD) and true for post bombardment of layered structure by MeV ions. As the ionizing MeV bombarding particle penetrates deeper inside the materials, the ions have less ionization stopping power, due to energy loss in the track. Thus for the case of post bombardment by MeV ions, the size of the nanocrystals decreases with depth in the stack. Thus, a gradient in nanocluster size may be produced by selecting the radiation ion and/or initial energy to produce the desired gradient.

The IBAD layer by layer method may be faster and lower cost than the post irradiation method and can provide finer control of composition and nanocluster size. IBAD typically, but not always, uses argon ion radiation in the range of 500 eV to 10 keV in order to produce nanoclusters in only a few surface layers. Thus, a few layers at a time may be produced and irradiated. In one alternative, only a single layer is penetrated and only a single nanocluster is produced for each ion. This allows adjustment of the ion energy and the metal nanocluster volume fraction, layer by layer, progressively through the stack buildup. In contrast, the post irradiation of stack by MeV ions may have an advantage in that the method produces nanoclusters arranged in a straight line along the ion track. The straight line alignment can enhance the electrical conductivity and further improve the figure of merit.

Nanocluster size may also be controlled by controlling the atomic fraction of deposited metal in each layer. This fraction is typically between 1% and 10%. Thus, the gradient produced by the ion stopping power characteristic may be fine tuned by varying the metal fraction progressively, layer by layer, through the stack.

In an alternative fabrication process, each layer may be irradiated during each layer deposition or after each layer deposition. In this layer by layer approach, a low energy irradiation may be used, for example an argon ion radiation in the range of 500 eV to 10 keV may produce nanoclusters in only a few surface layers. Thus, a few layers at a time may be produced and irradiated. This allows adjustment of the ion energy and the metal fraction, layer by layer, progressively through the stack buildup.

Arrangements of nanoclusters are sometimes referred to as a superlattice or pseudo-crystal, or quasi-crystal. The superlattice refers to the arrangement of nanoclusters rather than the arrangement of atoms within the nanoclusters. A highly ordered arrangement may be referred to as a regimented quantum dot superlattice (RQSL). The closely packed nanocluster arrangements produced by irradiation differ from a highly ordered RQSL structure by virtue that the nanocluster arrangement produced by irradiation has random order in one or more dimensions or aspects and may have regular order in other aspects. The ion beam delivers ions in random spatial distribution laterally across the layers.

The various embodiments of the present invention exhibit various degrees of order in the nanocluster arrangement. In the continuous, layerless, embodiment using the low energy ion beam in the IBAD process, the nanoclusters are fully random in lateral dimension and depth. However, in the layered structure embodiment where each layer is deposited and subsequently irradiated, the depth dimension exhibits order layer by layer. Within each layer the nanoclusters are randomly positioned laterally and randomly aligned with nanoclusters in subsequent layers. In the high energy ion beam embodiment, the MeV ions produce long tracks through multiple layers and thus produce lateral alignment of nanoclusters from layer to layer along each ion track, even though the ion tracks are random laterally from track to track. Thus the nanoclusters have layer order and layer to layer alignment.

In an exemplary layer by layer process, an IBAD process is configured to deposit two metals and silicon dioxide. An ion beam is set up to direct a beam of argon ions with a variable energy from 500 eV to 10 keV. Initially a layer is deposited with the first metal, for example, silver, and the silicon dioxide. After a desired thickness is deposited, for example, 1 nm, the ion beam irradiates the layer, starting at 500 eV. The ion beam is switched off and a second layer is deposited using the second metal, for example, gold, together with silicon dioxide. After the second layer is deposited to the desired thickness, the deposition is paused and the ion beam irradiates the second layer. The energy for the second layer may be increased by 200 eV to 700 eV. After the second layer, a third layer may be deposited, returning to the first metal. The ion beam then irradiates the third layer, increasing the energy by 200 eV to 900 eV. The process continues for as many layers as desired.

The argon ion beam is operated within a range to produce nanoclusters of desired size without penetrating deeply into the layer structure and becoming incorporated into the layer structure. Once the argon ion deposits its energy, the argon escapes back into the vacuum chamber and does not become incorporated into the layer. Too much argon in the layer structure may form gas bubbles and separate the layer. Energies much greater than 10 keV may cause too much argon inclusion in the silicon dioxide structure.

In a variation of the process, the ion beam may operate continuously while the deposition process operates. In the continuous process, the irradiation is measured as an arrival rate, which is the ratio of ions to a deposition component. Rutherford backscatter is typically used to measure the rate. An argon ion arrival rate on the order of one argon atom for ten metal atoms deposited in the layer appears to produce satisfactory results.

In a further variation of the process, the same metal may be used for all layers. Since the penetration depth of the low energy ion is only sufficient to generate a single nanocluster per ion, it is not necessary to change the metal or introduce an insulator layer to periodically quench the ion generated nanocluster trail to separate nanoclusters. The alternating metal layers are beneficial in the case of high energy ions that penetrate many layers. As the ion transitions from layer to layer, the crystallization stops for one metal and starts again with the second metal. This transition "quenches" the nanocluster between layers, creating a discontinuous electrical conductivity. As with the alternating layers, when a single metal is used, the nanocluster size may be varied by varying the beam energy or metal deposition atomic fraction or both. When the same metal is used, the process may be run in a continuous fashion without a clear distinction between layers, i.e., without producing distinct layers.

Since the phonons are scattered more easily by the larger nanoclusters and absorbed more easily by smaller nanoclusters, the temperature difference between hot and cold surface, delta Temperature ($\Delta T$), is increased due to improved phonon absorption and phonon blocking. This reduces the thermal conductivity, increasing the Figure of Merit ZT (inversely proportional to thermal conductivity).

In this work, Figures of merit as high as 3.5 have been achieved using layers of co-deposited gold and silicon dioxide, alternating with silver and silicon dioxide, sometimes with and sometimes without an interspersed layer of silicon dioxide. It has been found that nanoclusters form along an ion track passing through alternating metal co-depositions without the need for the insulator layer to periodically "quench" the track and isolate the clusters. The gold to silicon dioxide ratio was 0.01 to 0.04, whereas the silver to silicon dioxide ratio was 0.02 to 0.06. For IBAD with ion bombardment after each layer deposition, Argon ion radiation was used having initial energy between 500 eV to 10 keV. For post stack fabrication ion bombardment, five MeV silicon ions were used to irradiate the composite structure. This is the first time we have fabricated a stack by periodically changing the metal, in every other layer. In alternative variations, other metals and insulators may be substituted in such composite structure. In further variations, other layer period numbers may be employed, such as with a period of three different metal-silicon dioxide layers. Similarly, alternative ionizing energy and radiation ions may be used.

In one embodiment, a thickness of the first composite layer is less than three nanometers. In another embodiment, a thickness of the first composite layer is less than twenty nanometers.

The structure tolerates a wide range of metal to insulator ratio, and can tolerate cyclic temperature variation. The stack can operate both at room temperature (300K) and at high temperatures (1000K) which is unique among thermoelectric devices.

These and further benefits and features of the present invention are herein described in detail with reference to exemplary embodiments in accordance with the invention.

BRIEF DESCRIPTION OF THE FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The present invention achieves high efficiency by building a multilayer structure using periodic nanolayers of at least two different metals co-deposited with an insulator, e.g., $Au+SiO_2$ and $Ag+SiO_2$, i.e. one layer of a first metal co-deposited with an insulator followed by a second layer of a second metal co-deposited with the insulator, and then repeat the dual layers 100 to 1000 times or more, as desired. The TE devices fabricated either by producing nanolayers of nanocrystals of metal in an insulating host one at a time by either of following methods; A) deposition of nanolayer while bombard by low energy argon ions (IBAD), B) by low energy ion bombardment of each layer after the deposition of metal+ insulator deposition (co-deposited layer), or B) by post bombardment of produced multi-nanolayered system of $Au+SiO_2/Ag+SiO_2$ by MeV ions. For the case of post bombardment by MeV ions, the structure is irradiated with ionizing radiation to produce nanocrystals of each alternating metal in the co-deposited layers. The irradiation serves to increase the electrical conductivity of the structure, which increases the figure of merit (ZT) and to decrease the thermal conductivity of the structure, further increasing the figure of merit.

Thus, the structure may have periodic nanolayers of $Au+SiO_2$ and $Ag+SiO_2$ with no $SiO_2$ buffer layer. In an alternative embodiment, each metal layer may be followed by an insulator buffer layer.

In alternative embodiments, alternative metals and alternative insulators may be used.

Performance is further increased by producing a gradient of nanocluster size. The gradient is best used by applying the high temperature to the small nanocluster side of the layer structure. The gradient in nanocluster size may be produced by selecting irradiating ion and energy level to produce a decrease in energy deposition with distance through the structure.

Technology Background

The figure of merit, ZT, relates the critical properties of the device that determine the efficiency potential of the device.

$$ZT = S^2 \sigma T/k \qquad \text{Equation 1.}$$

where,

S is the Seebeck coefficient,
σ is the electrical conductivity,
T is the absolute temperature, Kelvin
k is the thermal conductivity.

Thus, it can be seen that the figure of merit is increased by increasing the Seebeck coefficient, and/or electrical conductivity and by decreasing the thermal conductivity. Increasing the temperature of operation also increases the figure of merit.

The Seebeck coefficient relates the voltage achieved by a temperature difference across the TE device and is typically expressed in microvolts per degree Kelvin.

The electrical conductivity refers to the conductivity parallel to the direction of heat transfer. The units are $(ohm-cm)^{-1}$.

The thermal conductivity through the layers is desired. Thin films present challenges to the measurement of thermal conductivity. A third harmonic technique (also referred to as a three omega, 3ω technique) may be used to determine thin film thermal conductivity.

Reduction in Nanocrystal Size:

Either by IBAD method or by low energy bombardment after each co-deposited layers is prepared, there is a very fine control in the size and volume fraction of nanocrystals by fine variation of the atomic percent of the deposited metal as well as fine variation of the energy and the current density of the bombarding ions from lower layers to the upper layers (from hot to cold side). For post bombardment by MeV ions due to the nature of the ionizing radiation, as the incident ion penetrates the matter, its energy is reduced, and the energy deposition in the material is reduced, thus the size of the nanocrystals produced reduced, with larger nanocrystals on the surface and smallest nanocrystals deep inside in the incident ion track.

Reduction in Thermal Conductivity:

Thermal conductivity reduced due to the nano-layered structures as well as quantum well structure, but eventually the reduction and phonon blocking due to nano-layers reaches it plateau due to the nature of the phonon scattering cross-section and lack of absorption by the upper layers where the larger size nanocrystals are located. The scattered phonons are absorbed at the high temperature side due to small scattering cross section and due to increased phonon absorption cross section by smaller nanocrystals produced deeper inside the layered structure by bombarding ions.

Increased Electrical Conductivity:

Due to increased volume fraction of Au and Ag in each layer and due to lack of any $SiO_2$ buffer layer the electrical conductivity is increased and thus, the performance figure of merit, ZT, is increased.

Figure 1:
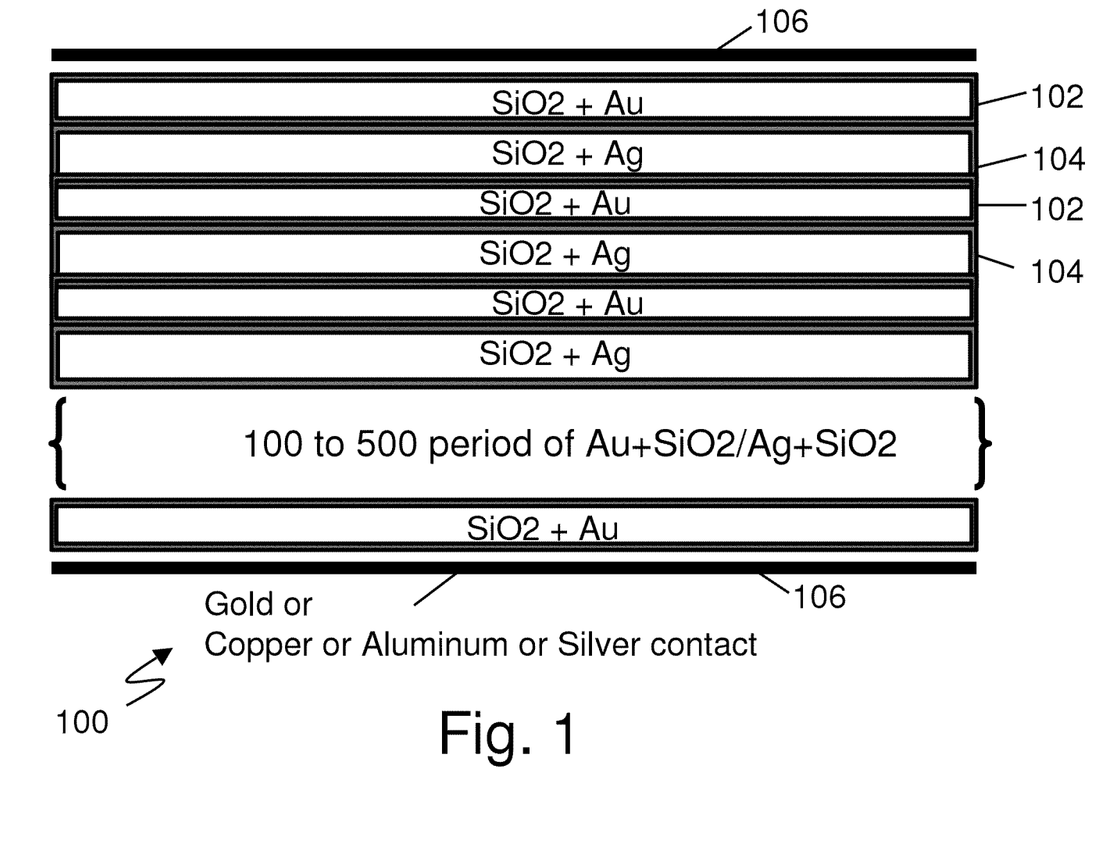
FIG. 1 depicts an exemplary thermoelectric layer structure in accordance with the present invention.

This work has taken advantage of periodic $Au+SiO_2/Ag+SiO_2$ layer structure which resulted a shift in the mini-phonon-band structure increasing the phonon absorption and scattering probability during each transmission through the $Au+SiO_2/Ag+SiO_2$ layer structure. In fact the $Au+SiO_2/Ag+SiO_2$ layer structure transmission line is a phonon trap where the nanocrystals of Au and Ag are smallest, while enhancing the electrical conductivity. This process can be applied to a system with three or four metal co-deposited layer, isothermal layer structure, as well to further enhance the phonon blocking for low temperature operation where a wider isothermal layer structure will, at low temperature, enhance the electrical conductivity as well as the Seebeck Coefficient.
Detailed Description of the Preferred Embodiments FIG. 1 depicts an exemplary thermoelectric layer structure in accordance with the present invention. FIG. 1 and other drawings in this disclosure may be exaggerated in scale to show more clearly the nano layers of the multilayer structure. Referring to FIG. 1, the layer structure 102/104 comprises a sequence of alternating layers of a first co-deposited metal/insulator 102 and a second co-deposited metal/insulator 104. Each layer is typically on the order of several nanometers thick, for example 1 to 2 nanometers thick. A stack of layers may be fabricated by a deposition process, such as MBE followed by post bombardment or IBAD. In one embodiment, a stack comprising multiple layers is fabricated and the entire stack is irradiated after fabrication with high energy ionizing radiation with ionizing radiation to generate nanocrystals in the metal/insulator layers. In an alternative embodiment, nanocrystals are generated during the fabrication of the stack by using relatively low energy radiation during or after the deposition (IBAD) for each layer. Thus, nanocrystals may be generated layer by layer using low energy ion bombardment. IBAD (Ion Beam Assisted Deposition) refers to a vacuum deposition process with the addition of low energy ion beam to assist in the deposition and nanocluster formation. In this case, the ion beam is used to generate nanoclusters during film deposition. The vacuum deposition process may include sputtering, physical vapor deposition, evaporative deposition, pulsed laser deposition, electron beam physical deposition, or other process for producing thin films.

The sequence of alternating layers 102/104 is sandwiched between two electrical/heat contact layers 106 on each side of the stack. The electrical and heat contact layers 106 provide efficient electrical current distribution from contact wires to the full area of the stack of alternating layers 102/104 and provide efficient thermal contact between the stack 102 and heat source and sink structures (not shown) that may be in contact with the layer structure 102. The direction of heat transfer is from hot to cold and is perpendicular to the plane of the layers comprising the stack 102/104. Equivalently, the direction of heat transfer may be characterized as from layer to layer rather than laterally within a layer, or cross plane rather than in plane. The number of periods in a stack may be, for example 200, for a laboratory sample, however, the number of periods may be any number. As manufacturing techniques evolve, very large numbers of layers may be feasible, alternatively, devices with very few layers may find application in micro and nano-technology applications.

The device may be used in either thermoelectric generator mode, i.e., for generation of electrical energy, or in thermoelectric cooling or heating mode, also referred to as Peltier mode, i.e., for heating or cooling.

The composition of the composite layers 102 is referred to as $Au_x/SiO_{2(1-x)}$, where x is the atomic percentage of gold and 1−x is the percentage of $SiO_2$. The composition of the second composite layers 104 is referred to as $Ag_x/SiO_{2(1-x)}$, where x is the percentage of silver, and 1−x is the percentage of $SiO_2$. The contact layers 106 may be any suitable conductor, typically gold, copper, silver, or aluminum. The test samples used gold.

Layer forming methods include Molecular Beam Epitaxy (MBE) or evaporation deposition, followed by MeV bombardment of the stack or ion beam assisted deposition (IBAD) (either using e-beam evaporation or sputter beam evaporation—simultaneous deposition and low energy bombardment), or evaporation followed by ion bombardment of each layer, vacuum evaporation, sputtering and other methods that yield a uniform mixture and yield a controlled layer thickness. It is an advantage of the invention that all of the layers, including the contact layers, may be grown in the same chamber run sequence using one vacuum pump down cycle. The deposition of alternate layers may be achieved by turning on and off various sources associated with each layer and bombard the layer either during or after the deposition by low energy ion in the same process chamber. The capability to form a large number of layers consisting nanocrystals in a single system consisting of the deposition and low energy ion bombardment systems will lower production costs for a mass produced product.

Silicon dioxide was used as the host. Other untested insulating materials that are expected to perform well include, but are not limited to: silicon monoxide, silicon nitride, aluminum oxides, vanadium oxides, magnesium fluoride, zinc sulphide, titanium dioxide, and calcium fluoride, all of which may help to produce high Seebeck Coefficient ($S^2$) as well as reduce the thermal conductivity, while allowing the tunneling of electrons from one nanocluster the next nanocluster. Although it may be preferred for convenience of the layer deposition process to use the same host material for all of the composite layers, different host materials may be used for the different composite layers.

For the metal component of the metal-insulator composites 102 and 104, any metal may be used, including alloys. As long as the metals are conducting and even if the alloy metals change phase at various temperatures. Exemplary metals that are expected to perform well, but have not been tested include, but are not limited to: copper, platinum, and aluminum.

The metal layers 106 used for electrical and thermal contact may be any conducting metal or alloy or other conducting material. Gold and copper were used for the test samples, however other metals which are not tested but are expected to perform well include, but are not limited to: silver, aluminum, and platinum. Note also that the electrical contact layers and/or thermal contact layers may be conveniently applied during the deposition process, but may alternatively be applied by other methods, such as coating, painting, electroplating, or by contacting the layer structure. For production, the contact layer may already be on polymer or a flexible composite film to allow flexible applicability of the final device.

The outer layers of the stack may be either types of the composite metal/Insulator layer of $Au/SiO_2$ or $Ag/SiO_2$.

The stack is typically deposited on a substrate which can be fused silica, silicon or conductive polymers or any thermally and electrically conductive substrate. In one embodiment, the use of a thermally and electrically conductive substrate eliminate the need for deposition of the conducting layers, thus reducing the cost of the mass production.

Heat moves transverse (orthogonal) to the plane of the layers. In TE generator applications, heat may be applied to one side of the stack and moves perpendicular to the stack to the other side of the stack.

Figure 2:
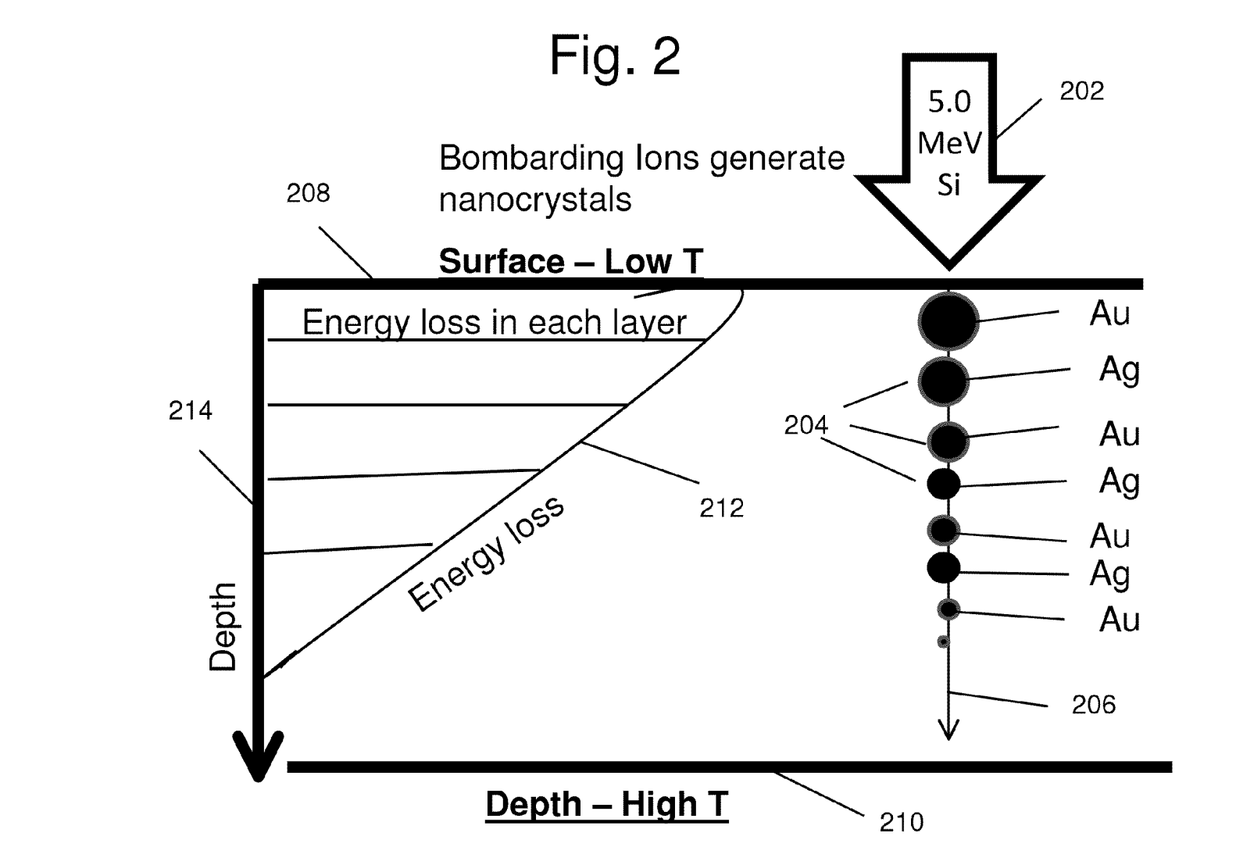
FIG. 2 illustrates the formation of nanocrystals of graduated size in the MeV ion beam track due to the electronic energy deposition characteristic of the MeV ion in the layer structure.

FIG. 2 illustrates the formation of nanocrystals of graduated size in the MeV ion beam track due to the electronic energy deposition characteristic of the MeV ion in the layer structure.

Referring to FIG. 2, a 5 MeV silicon ion 202 is depicted penetrating a layer structure surface 208. The ion track 206 is shown through the layers and nanocrystals 204 are depicted as being formed along the track 206. The nanocrystals 204 are decreasing in size along the track due to the decreasing energy deposition of the silicon ion. Deposition energy loss as a function of depth 214 is shown as a graph 212 in association with the pictorial representation of the nanocrystal formation 204. Alternatively or in addition, substrate composition or co-deposition fraction may vary from layer to layer to modify the deposition and resulting nanocrystal size profile. As shown in FIG. 2, each successive layer is co-deposited with a different metal, Au/Ag. The change from one metal to a different metal is believed to be responsible for "quenching" the nanocrystal formation and creating a barrier between nanocrystals. The graduation in nanocrystal size is favorable for reducing the heat flow by phonon propagation from the hot surface 210 (with small nanocrystals) to the cool surface 208 (with larger nanocrystals). Thus, performance may be somewhat greater by using the ion entry surface 208 (having the largest nanocrystals) as the cold side in an application and using the other surface 210 (having the smaller nanocrystals) as the hot side of the application.

Figure 3:
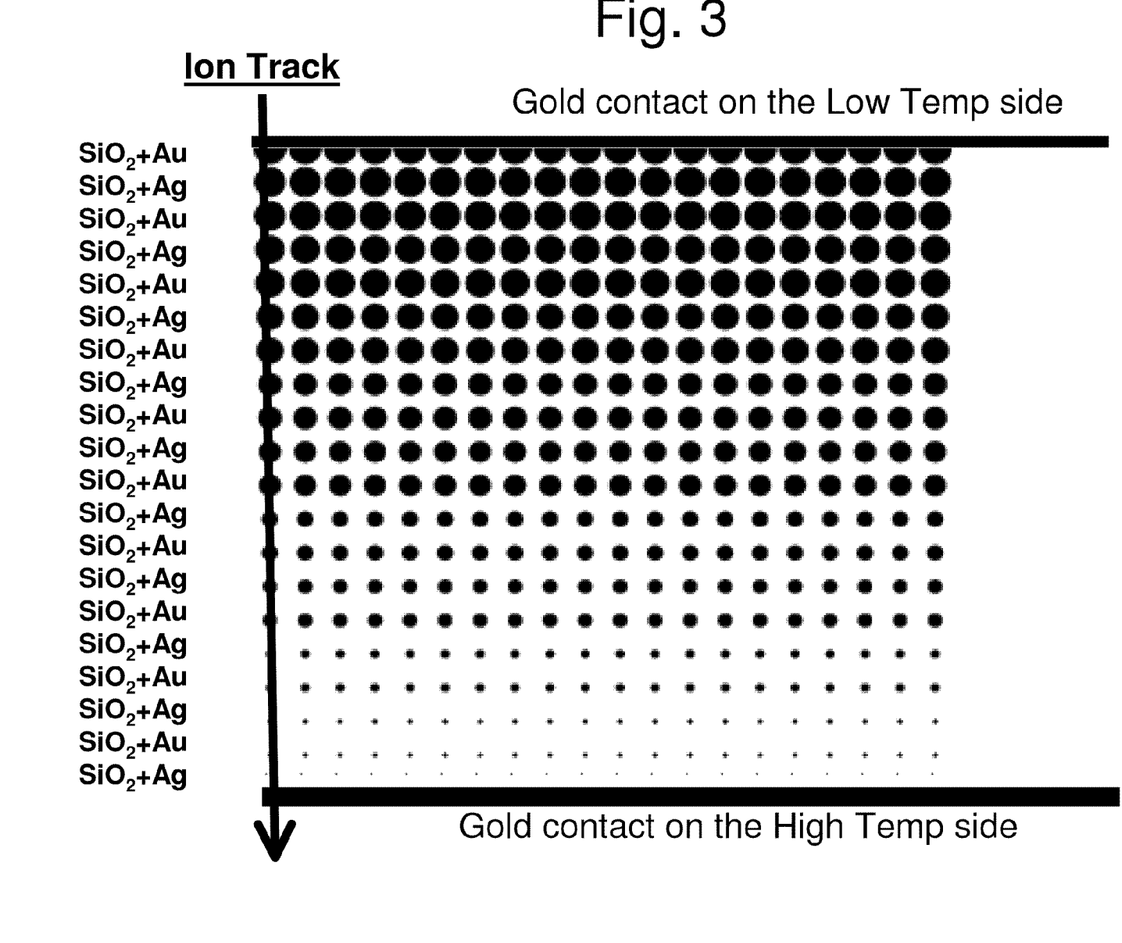
FIG. 3 depicts nanocrystals size varying from large size on the top layer (preferably used for low temperature) to small size in the lowest layers at the preferably hot temperature side.

FIG. 3 depicts nanocrystals size varying from large size on the top layer (preferably used for low temperature) to small size in the lowest layers at the preferably hot temperature side. FIG. 3 represents the formation of nanocrystals using post bombardment by MeV ions in the MeV ion beam track, because of the electronic energy loss due to ionization. Since the trajectory of each high energy ion is almost straight line and since as MeV ion penetrate the substrate its energy loss per unit volume is reduced the nanocrystals are formed in a straight-line starting with largest nanocrystals, due to larger energy loss, on the surface and smallest nanocrystals in depth, due to smaller energy loss.

TABLE 1

Samples of 100 period nanolayers of $Au_xSiO_{2(1-x)}/Ag_ySiO_{2(1-y)}$

| Fluence | Seebeck Coefficient[2] $(V/K)^2$ | Electrical Conductivity (1/Ohm*M) | Thermal Conductivity (W/m·K) | Figure of Merit (at 350K) |
|---|---|---|---|---|
| zero | 4.12 E−8 | 1200 | 4.10 | $4.22 \times 10^{-3}$ |
| 1 e13/cm² | 6.16E−8 | 3500 | 2.99 | $25.2 \times 10^{-3}$ |
| 8 e13/cm² | 1.34E−7 | 88000 | 1.3 | 3.17 |
| 1 e15/cm² | 1.05E−7 | 78670 | 2.1 | 1.38 |

Table 1 shows the results of fabrication of an experimental sample comprising 100 period nanolayers of $Au_xSiO_{2(1-x)}/Ag_ySiO_{2(1-y)}$, where $0.01<x<0.1$ and $0.01<y<0.1$. Several samples were grown mostly on fused silica due to the cost of laboratory production. The layers were deposited using an MAD system. Three evaporators were utilized, one configured with gold, one with silver and one with silica ($SiO_2$). The gold contact layers and the co-deposited composite layers of $Au_xSiO_{2(1-x)}/Ag_ySiO_{2(1-y)}$ were formed by appropriately enabling and adjusting the three evaporators to produce each successive layer. The thickness of each layer was controlled and monitored by a quartz resonator deposition monitor.

The multilayer films on the silica substrates were used for variety of measurements, such as; Seebeck coefficient measurements, electrical conductivity and thermal conductivity measurements, thermal conductivity measurements (using 3 omega technique "3ω") and for Rutherford backscattering spectrometry (RBS) to study change in the layer composition and measure the metal content in layered stack. The geometry in FIG. 1 shows two Au contact layers, one each on the top and bottom of the multilayers. These contacts were used in the Seebeck coefficient measurement system and were also used when electric contact was needed.

Cross plane thermal conductivity was measured by the 3ω) (also referred to as the three omega and third harmonic) technique. The thermal conductivity measurement was performed at 300K to 350K. A narrow platinum (Pt) strip is deposited onto the films, providing a heater with a resistance value of about 200 ohms. Four terminals are provided on the Pt strip, two outer terminals for applying current, and two inner terminals for sensing voltage drop across the strip. The strip is used for applying heat input to the layer and for measuring the resulting temperature changes. A sine wave current at a fundamental frequency ω is applied. This produces heating that has a 2ω component. The resistance of the Pt film is a function of the temperature achieved, which is a function of the thermal conductivity and specific heat of the material in response to the 2ω heating. The voltage across the Pt film is v=I(ω)r(2ω). This product generates a component at 3ω which may be measured to determine thermal conductivity. The dynamics are well known in the literature. The thermal conductivity, k, may be determined as:

$$k = \frac{V^3 \ln\frac{f_2}{f_1}}{4\pi l R(V_{31} - V_{32})} \alpha$$

Where, $f_1$ and $f_2$ are two test current drive frequencies,
V is the nominal voltage measured across the Pt film,
l is the length of Pt film over which V is measured,
R is the nominal resistance of the Pt film,
α is dR/dT, the dependence of resistance on temperature,
$V_{31}$ is the in phase third harmonic voltage for $f_1$, and
$V_{32}$ is the in phase third harmonic voltage for $f_2$.

The typical length of the test portion of the Pt strip may be 4 to 5 mm and the typical width may be 1 mm. The thickness may be 250 to 500 nm.

Thermal conductivities of multi-layered samples before and after bombardment by 5 MeV Si ion at various fluences were measured. The units are mW/(cm° K). Further details on the third harmonic technique may be found in David G. Cahill, "Thermal conductivity measurement from 30 to 750K: the 3ω method", Review of Scientific Instrumentation, 61(2), February 1990, which is incorporated herein by reference.

Figure 4:
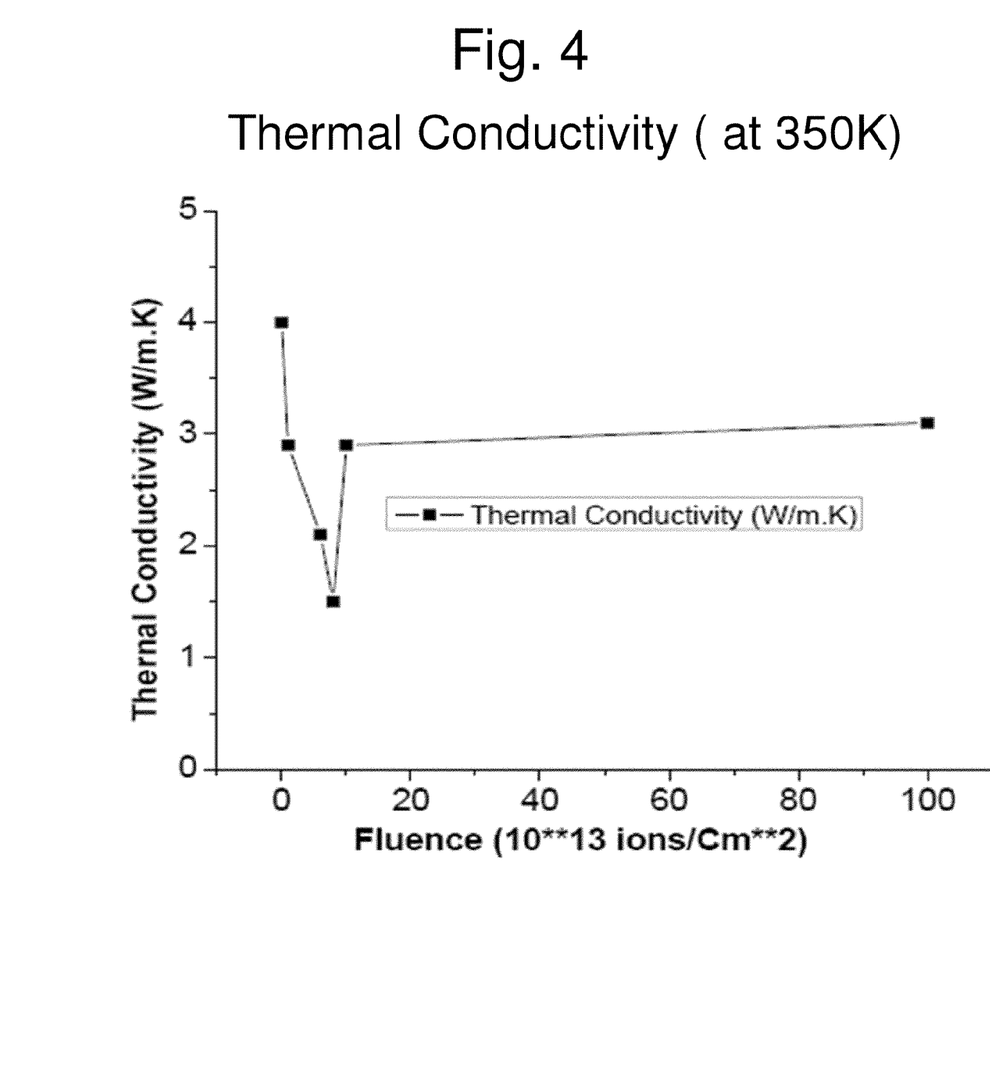
FIG. 4 shows thermal conductivity (W/m·K), conducted at room temperature (350K), as a function of bombarding fluence of 5 MeV Si ions for an exemplary device.

FIG. 4 shows thermal conductivity (W/m·K), conducted at room temperature (350K), as a function of bombarding fluence of 5 MeV Si ions for an exemplary device. The starting point at no bombardment and the lowest value of the thermal conductivity is at 8×1013/cm2 fluence after which the thermal conductivity continues to increase.

The lowest Thermal Conductivity obtained for the process of low energy ion bombardment of each co-deposited composite layer was about 1.2 (W/m·k), using 500 eV to 10 keV argon ions (at 350K).

Figure 5:
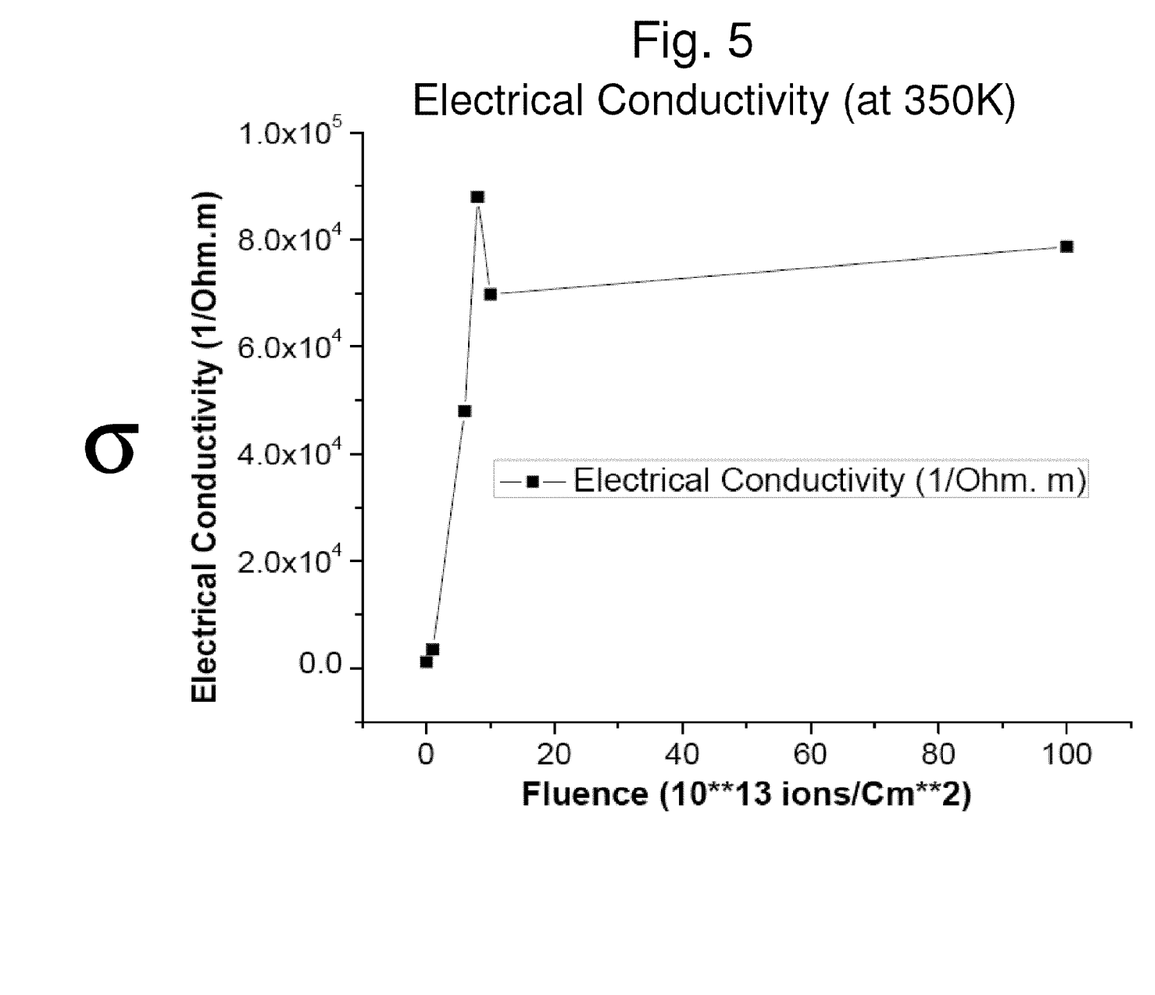
FIG. 5 shows the Electrical Conductivity (1/Ohm·m) conducted at room temperature (350K), as a function of bombarding fluence of 5 MeV Si ions for an exemplary device.

FIG. 5 shows the Electrical Conductivity (1/Ohm·m) conducted at room temperature (350K), as a function of bombarding fluence of 5 MeV Si ions for an exemplary device. The starting point at no bombardment and the highest value of the electrical conductivity is at 8×1013/cm2 fluence after which the electrical conductivity continues to decrease.

The highest Electrical Conductivity obtained for the process of low energy ion bombardment of each co-deposited composite layer was nearly 90,000 (1/Ohm·m), using 500 eV to 10 keV argon ions (at 350K).

Figure 6:
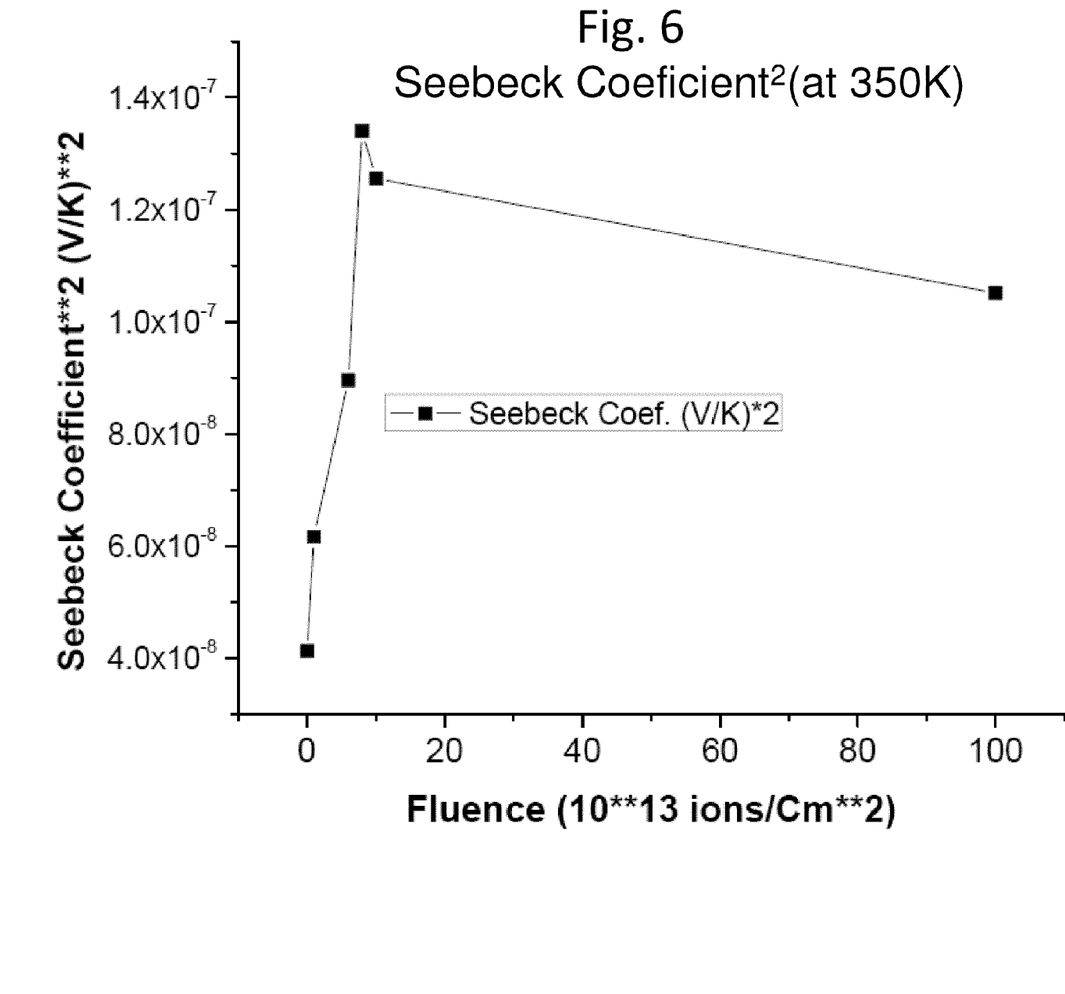
FIG. 6 illustrates a graph of the Seebeck Coeficient, (more precisely the square of the Seebeck coefficient) (V/k)**2, conducted at room temperature (350K), as a function of bombarding fluence of 5 MeV Si ions for an exemplary sample device.

FIG. 6 illustrates a graph of the Seebeck Coeficient, (more precisely the square of the Seebeck coefficient) (V/k))2, conducted at room temperature (350K), as a function of bombarding fluence of 5 MeV Si ions for an exemplary sample device. The starting point at no bombardment and the highest value of the (Seebeck Coefficient)2 is at 8×1013/cm2 fluence after which the (Seebeck Coefficient)**2 continues to decrease.

The highest Seebeck Coefficient$^2$ ($S^2$) obtained for the process of low energy ion bombardment of each co-deposited composite layer was $1.37 \times 10^{-7}$ ($(V/k)^2$), using 500 eV to 10 keV argon ions (at 350K).

Figure 7A:
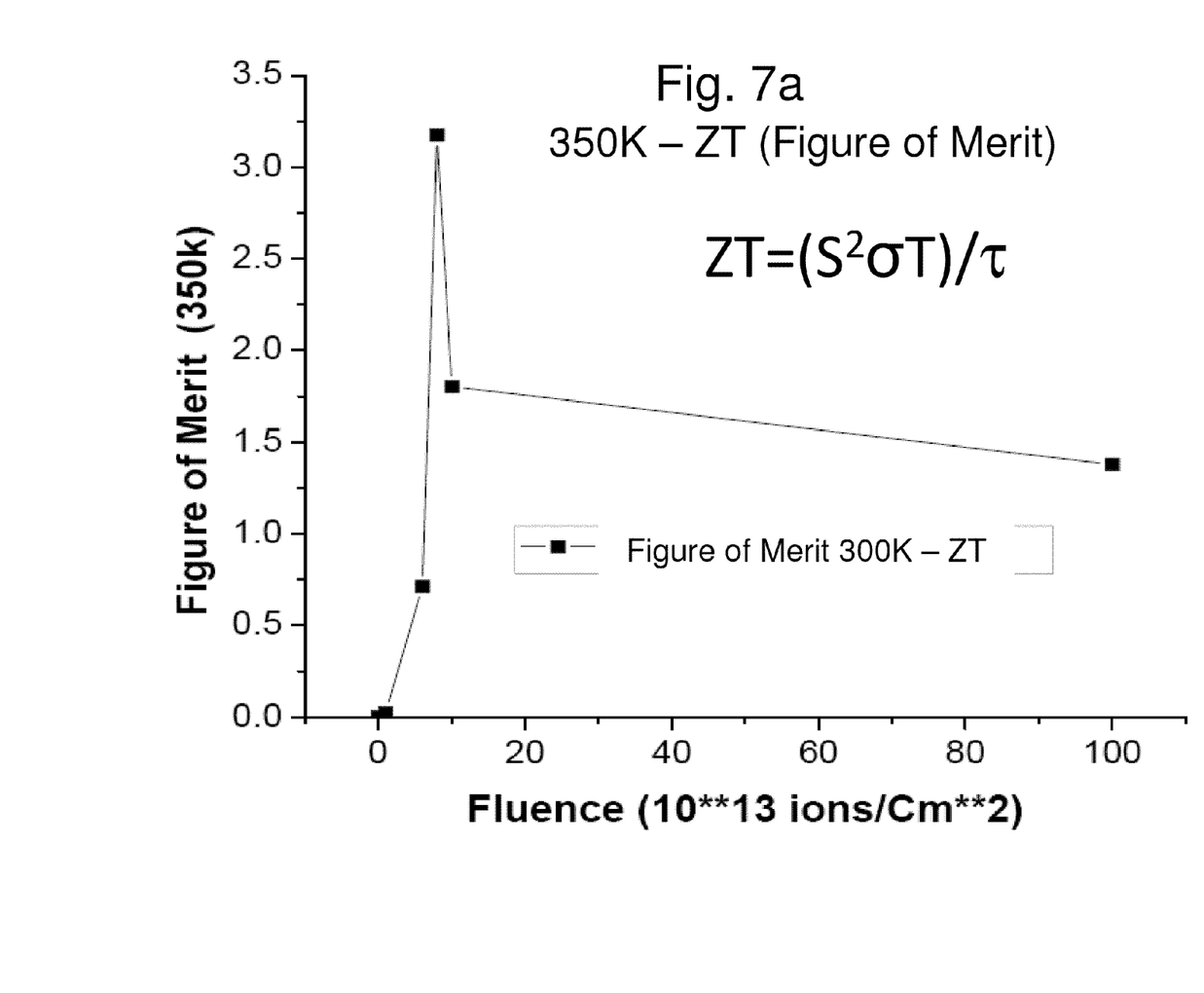
FIG. 7a illustrates a graph of a Figure of Merit—ZT, showing the Figure of Merit (ZT) at room temperature (350K), as a function of bombarding fluence of 5 MeV Si ions for an exemplary sample device.

FIG. 7a illustrates a graph of a Figure of Merit—ZT, showing the Figure of Merit (ZT) at room temperature (350K), as a function of bombarding fluence of 5 MeV Si ions for an exemplary sample device. The starting point at no bombardment and the highest value of the (ZT) is at 8×1013/cm2 fluence after which the (ZT) continues to decrease.

The highest Figure of Merit—ZT obtained for the process of low energy ion bombardment of each co-deposited composite layer was nearly 3.6, using 500 eV to 10 keV argon ions (at 350$k$).

Figure 7B:
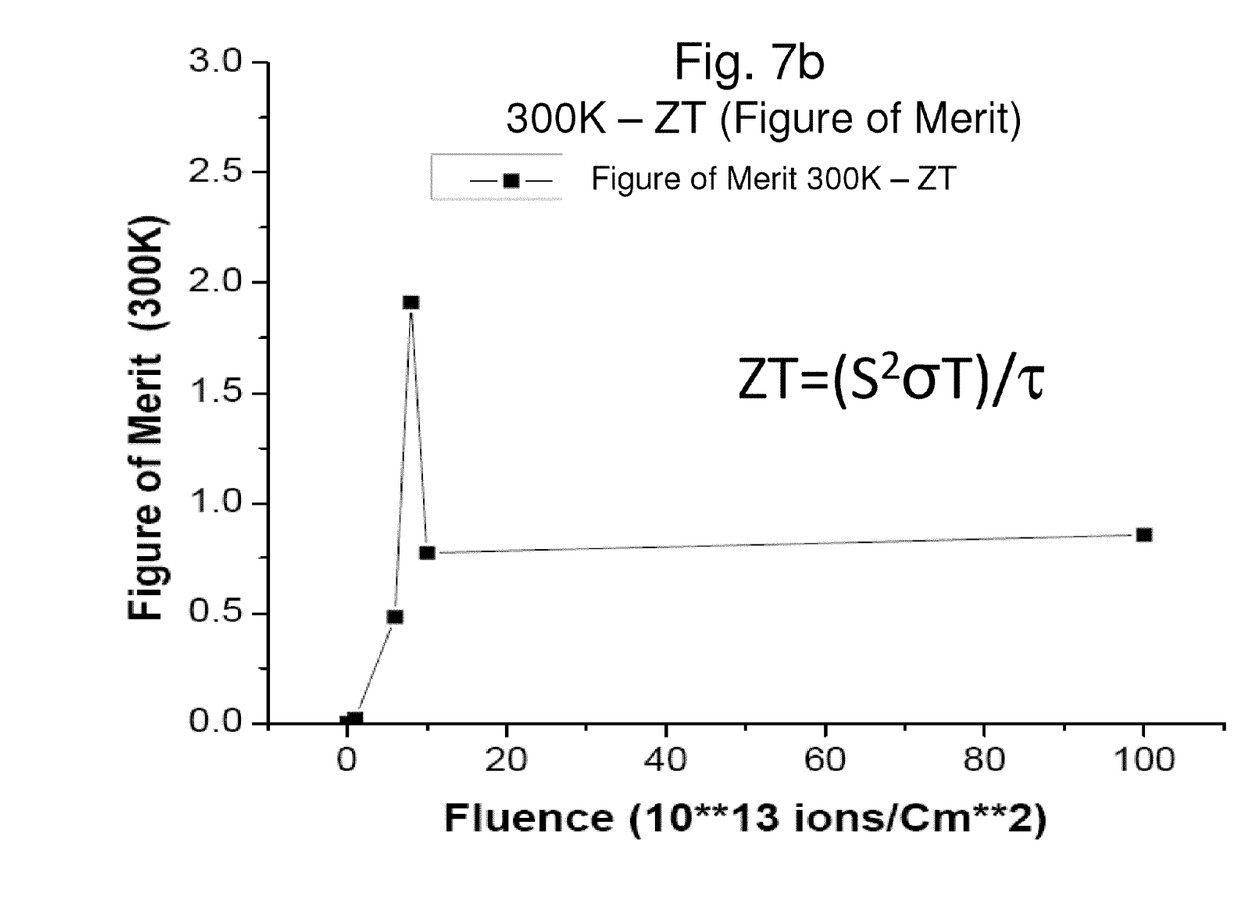
FIG. 7b illustrates a graph of a Figure of Merit—ZT, showing the change in the Figure of Merit (ZT) at room temperature (300K), as a function of bombarding fluence of 5 MeV Si ions for an exemplary sample device.

FIG. 7b illustrates a graph of a Figure of Merit—ZT, showing the change in the Figure of Merit (ZT) at room temperature (300K), as a function of bombarding fluence of 5 MeV Si ions for an exemplary sample device. The starting point at no bombardment and the highest value of the (ZT) is at 8×1013/cm2 fluence after which the (ZT) continues to decrease.

Figure 8:
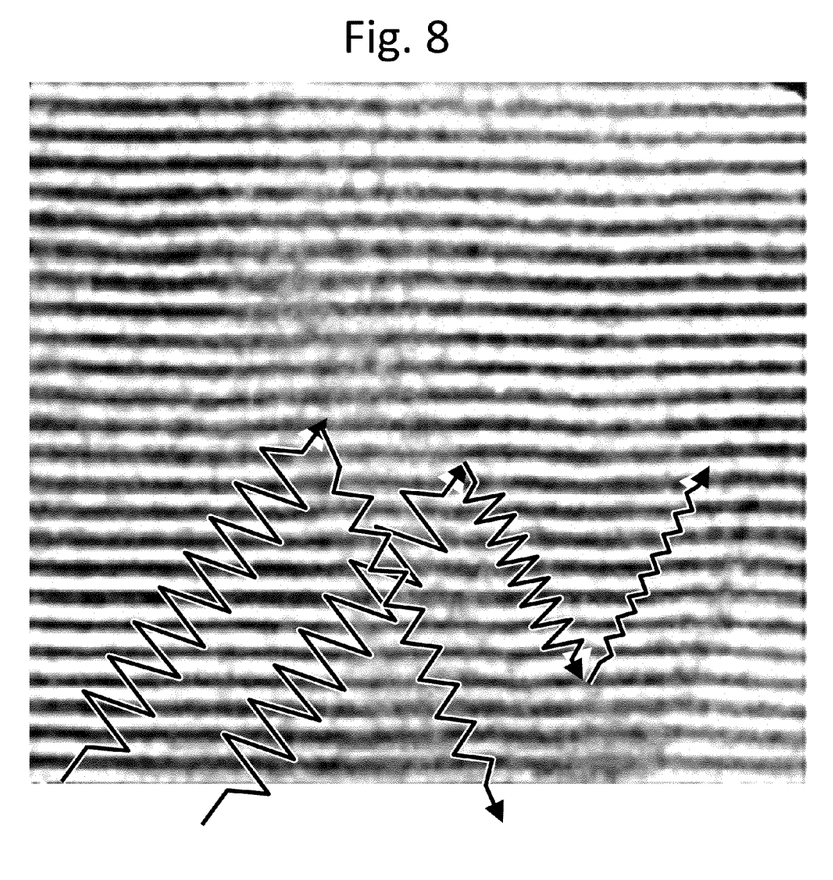
FIG. 8 depicts phonon scattering/blocking from periodic nano-layered structure system without nanocrystals.

FIG. 8 depicts phonon scattering/blocking from periodic nano-layered structure system without nanocrystals. Phonons, which are one heat conduction mechanism, are absorbed, reflected, scattered in a relatively equal manner for either direction—top to bottom or bottom to top.

Figure 9:
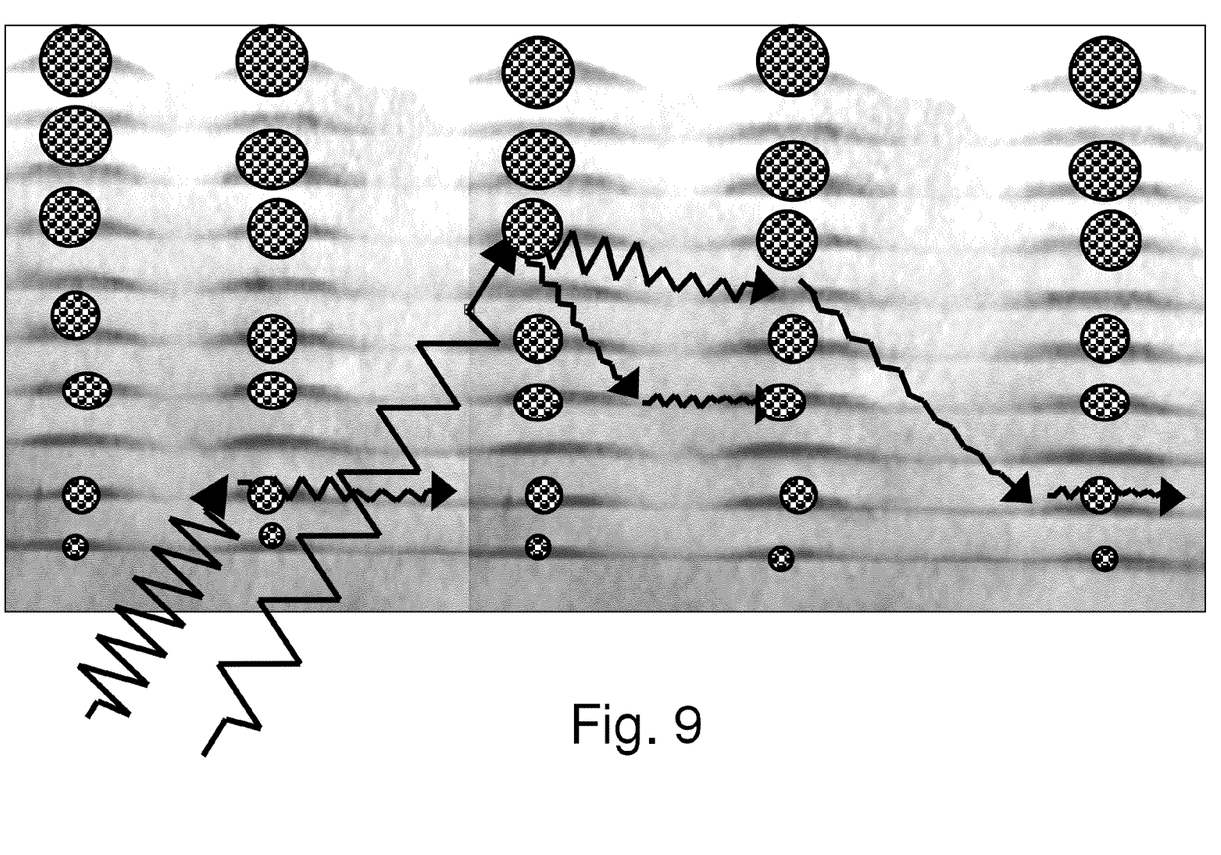
FIG. 9 depicts phonon scattering/blocking and phonon absorption from the periodic nano-layered nanocrystal structure system.

FIG. 9 depicts phonon scattering/blocking and phonon absorption from the periodic nano-layered nanocrystal structure system. Periodic nano crystal layer structure is depicted on top of a photomicrograph of such structure. Phonons are depicted scattering among the matrix. It may be appreciated that phonons scattering bottom to top encounter increasing density of larger nanocrystals; whereas phonons scattering top to bottom encounter lower density nanocrystals and thus conduct more easily top to bottom. This contributes to a lower thermal conductivity bottom to top and thus better performance when the bottom is the hot surface and top is the cool surface.

Applications

Applications for this device include all of the traditional TE generator and TE cooler applications as well as new applications enabled by the higher figure of merit, specifically at temperature below boiling temperature of water. Some new applications include utilization of wasted heat around the automobile engines (300° K to 370° K), aircraft engines (>300° K), and spacecraft engines (>>300K). Production of energy from the heat in the warm days of the year (>300° K) or from human body heat. Similarly such system can be used to cool down the selected area on a chip by mapping the Peltier device on the back or the front of the micro- or nano-electronic device. As well as application in bio-medical industry to operated in vitro devices using the temperature difference of few degrees to generate power needed to operate such devices for the lifetime of the device with no need for an additional charger or batteries.

The invention is shown with layers in a planar form; however, the layers may be applied to complex curved shapes. In particular cylinders, such as pipes, are commonly used in heat transfer applications. The TE layers may be deposited on the surface of pipes to be used in heat transfer applications.

CONCLUSION

One should understand that numerous variations may be made by one skilled in the art based on the teachings herein. Such variations include but are not limited to variations in order of steps, additional steps, omitted optional steps or elements. The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Directions, such as up or down, typically relate to the drawing on the page and are for convenience of description. The device may be operated in any orientation relative to gravity.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A thermoelectric device comprising:
   a periodic mutilayer structure having a plurality of periods, each of said periods comprising:
   1) a first composite layer comprising a first metal/material mixture, said first metal/material mixture comprising a first metal and a first electrical insulating material; said first metal/material mixture comprising nanoclusters of said first metal material; and
   2) a second composite layer in contact with said first composite layer, said second composite layer comprising a second metal/material mixture, said second metal/material mixture comprising a second metal material and a second electrical insulating material; said second metal/material mixture comprising nanoclusters of said second metal material, said second composite layer differing from said first composite layer by said second metal material or said second insulating material; and
   said multilayer structure having a first contact layer for electrical and thermal coupling to said periodic multilayer structure; and
   a second contact layer for electrical and thermal coupling to said periodic multilayer structure;
   each of said periods of said plurality of periods having no insulating layer free of metal mixture.

2. The thermoelectric device of claim 1, wherein a thickness of the first composite layer is less than three nanometers.

3. The thermoelectric device as recited in claim 1, wherein a thickness of the first composite layer is less than twenty nanometers.

4. The thermoelectric device as recited in claim 1, wherein said nanoclusters of said first metal material, are formed by ionizing radiation.

5. The thermoelectric device as recited in claim 4, wherein the ionizing radiation comprises x-rays, gamma rays, electrons, protons, or ions.

6. The thermoelectric device as recited in claim 5, wherein said the ionizing radiation is low energy ionizing radiation between 500 eV and 100 keV.

7. The thermoelectric device as recited in claim 5, wherein said the ionizing radiation is high energy ionizing radiation with initial energy greater than 1 MeV.

8. The thermoelectric device as recited in claim 5, wherein the ionizing radiation comprises ions with initial energy greater than 3 MeV.

9. The thermoelectric device as recited in claim 5, wherein the ion initial energy is selected such that an ion stopping power decreases through subsequent periods of the periodic multilayer structure.

10. The thermoelectric device as recited in claim 5, wherein the ionizing radiation has a fluence greater than 1013 ions per square centimeter.

11. The thermoelectric device as recited in claim 4, wherein the ionizing radiation penetrates all layers of the periodic multilayer structure.

12. The thermoelectric device as recited in claim 1, wherein an operational heat flux direction is through the thickness dimension of the periodic multilayer structure.

13. The thermoelectric device as recited in claim 1, wherein the thermoelectric device is used to generate electric energy from a temperature difference source.

14. The thermoelectric device as recited in claim 1, wherein the thermoelectric device is used to produce a temperature difference from an electrical energy source.

15. The thermoelectric device as recited in claim 1, wherein the first electrical insulating material and second electrical insulating material are the same material.

16. The thermoelectric device as recited in claim 1, wherein the number of periods in the periodic multilayer structure is greater than 40.

17. The thermoelectric device as recited in claim 1, wherein the first electrical insulating material is $SiO_2$.

18. The thermoelectric device as recited in claim 1, wherein said first metal material with said first electrical insulating material is gold.

19. The thermoelectric device as recited in claim 1, wherein said second metal material is different from said first metal material.

20. The thermoelectric device as recited in claim 1, wherein said nanoclusters of said first metal material are distributed randomly across at least one layer.

* * * * *